United States Patent
Desai et al.

(10) Patent No.: US 8,218,611 B2
(45) Date of Patent: Jul. 10, 2012

(54) SIGNAL GENERATOR PROVIDING ISI SCALING TO TOUCHSTONE FILES

(75) Inventors: Sampathkumar R. Desai, Bangalore (IN); Muralidharan A. Karapattu, Bangalore (IN)

(73) Assignee: Tektronix International Sales GmbH, Rheinfall (CH)

( * ) Notice: Subject to any disclaimer, the term of this patent is extended or adjusted under 35 U.S.C. 154(b) by 797 days.

(21) Appl. No.: 12/357,298

(22) Filed: Jan. 21, 2009

(65) Prior Publication Data

US 2009/0195498 A1    Aug. 6, 2009

(30) Foreign Application Priority Data

Feb. 1, 2008   (IN) .......................... 227/MUM/2008

(51) Int. Cl.
*H04B 3/46* (2006.01)

(52) U.S. Cl. .................. 375/224; 375/226; 375/232

(58) Field of Classification Search .............. 375/224, 375/226, 232
See application file for complete search history.

(56) References Cited

U.S. PATENT DOCUMENTS

| | | | |
|---|---|---|---|
| 2005/0008070 A1* | 1/2005 | Wang et al. | 375/232 |
| 2006/0101135 A1* | 5/2006 | Li | 709/223 |
| 2007/0100596 A1* | 5/2007 | Hollis | 703/14 |
| 2008/0056408 A1* | 3/2008 | Mezer | 375/316 |
| 2008/0228426 A1* | 9/2008 | Calvin et al. | 702/124 |
| 2009/0195498 A1* | 8/2009 | Karapattu et al. | 345/156 |
| 2009/0195525 A1* | 8/2009 | Karapattu et al. | 345/208 |

* cited by examiner

*Primary Examiner* — Thuan Do
*Assistant Examiner* — Mohammed Alam
(74) *Attorney, Agent, or Firm* — William K. Bucher

(57) ABSTRACT

A device and method for producing Inter Symbol Interference (ISI) scaling of S-Parameter Touchstone files for the generation of ISI scaling effects on serial data patterns by direct digital synthesis is described. The features of the present invention allow user to set parameters such as data rate, voltage amplitude, encoding scheme etc. as per requirements for the serial data patterns. An ISI scaling value is selected and applied to an S-Parameter Touchstone file representing transmission path effects. The serial data pattern parameters and the ISI scaling value used with the S-Parameter Touchstone file are compiled to generate a digital data waveform record file. The digital waveform record file is applied to a waveform generation circuit for converting the digital data into an analog serial data pattern with ISI scaling effects.

14 Claims, 14 Drawing Sheets

Figure 5

SIGNAL GENERATOR PROVIDING ISI SCALING TO TOUCHSTONE FILES

TECHNICAL FIELD

The present invention relates generally to signal generators and more specifically to a signal generator that scales the effects of Touchstone files which characterize the transmission paths of serial data.

CROSS-REFERENCE TO RELATED APPLICATIONS

This application claims the benefit of priority of Indian Provisional Application No. 227/MUM/2008, filed Feb. 1, 2008.

BACKGROUND OF THE INVENTION

High speed serial data designers are required to design robust and reliable serial data receivers to meet required Bit Error Rates (BER) for specific conditions. Physical channels between serial data transmitters and receivers, such as Printed Circuit Board (PCB) traces, cables, connectors and the like, cause loss of high frequency components in a high speed serial data signal due to skin effects, dielectric loss and the like. The net effect of this leads to Inter Symbol Interference (ISI). The transmission path of physical channels are preferably characterized by S-Parameter responses acquired using a Vector Network Analyzer (VNA) or the like. The S-Parameter characteristics of physical channel transmission paths are sets of S-Parameters for a series of discrete frequencies which are stored as Touchstone files. Based on the number of ports in a network representing a physical channel transmission path, various combinations of S-Parameters are measured.

An equivalent response filter can be derived from the S-Parameters in a physical channel transmission path Touchstone file to generate the effects of the physical channel transmission path. Serial data may be generated using this filter to measure the performance of the serial data receiver. It may be necessary for a designer to change the physical channel or modify the parameters of the physical channel, such as the length of the PCB trace, cable length, connector type and the like, to increase the performance of the serial data receiver. This requires a designer to measure the modified physical channel to characterize the S-Parameters of the modified transmission path. Characterizing the S-Parameters of a physical channel transmission path using a VNA is generally a time consuming activity. Moreover, the desired physical channel may not be available due to the non-availability of the components for the modified physical channel (e.g. a modified PCB with a new trace length).

SUMMARY OF THE INVENTION

Accordingly, the present invention is to a signal generating device, such as a signal generator, and a method of setting serial data pattern parameters and an intersymbol interference scaling parameter for a Touchstone file to generate a serial data pattern representing varying characteristics of a signal path. A signal generating device has a display and a central processing unit that generates a user interface on the display for setting parameters of a serial data pattern, selecting an S-parameter file representing a measured signal path and an intersymbol interference parameter for scaling magnitude values in the S-parameter file. The central processing unit generates a waveform record file using the serial data pattern parameters and the S-parameter file modified by the intersymbol interference scaling parameter. A waveform generation circuit receives the waveform record file and generates a serial data pattern analog output signal having the serial data pattern modified by the S-parameter file having magnitude values scaled by the intersymbol interference scaling parameter.

The display may be an external display coupled to the signal generating device. An external controller, such as a personal computer, is coupled to the signal generating device with the external controller generating the user interface on an external display for setting parameters for the serial data pattern, selecting an S-parameter file representing a measured signal path and an intersymbol interference parameter for scaling magnitude values in the S-parameter file and generating a waveform record file using the serial data pattern parameters and the S-parameter file modified by the intersymbol interference scaling parameter for use by the waveform generation circuit.

The intersymbol interference scaling factor has a range from 0.0 to 10.0 with the central processing unit incrementing the intersymbol interference scaling factor in units of 0.001. The S-parameter file is preferably a Touchstone file. The S-parameter file may be a 1-port, 2-port, 4-port single ended or a 4-port differential S-parameter file. The method of generating a serial data pattern representing varying characteristics of a signal path has the steps of generating a user interface on a display device for setting serial data pattern parameters, selecting an S-parameter file representing a measured signal path and an intersymbol interference parameter for scaling magnitude values in the S-parameter file and selecting the serial data pattern parameters, the S-parameter file representing a measured signal path and the intersymbol interference parameter for scaling magnitude values in the S-parameter file. A waveform record file is generated using the serial data pattern parameters and the S-parameter file modified by the intersymbol interference scaling parameter and a serial data pattern analog output signal is generated from the waveform record file having a serial data pattern modified by the S-parameter file having magnitude values scaled by the intersymbol interference scaling parameter.

The intersymbol interference scaling parameter is preferably incremented in units of 0.001 over a range of 0.000 to 10.000. The generation of the waveform record file includes the step of compiling the serial data parameters to generate serial data pattern digital data modified by the S-parameter file having magnitude values determined by the intersymbol interference scaling parameter. The selecting of the S-parameter file further has the step of selecting at least a first port configuration for the measured signal path, where the port configuration may be a 1-port, 2-port, 4-port single ended or a 4-port differential configuration.

The objects, advantages and other novel features of the present invention are apparent from the following detailed description when read in conjunction with the appended claims and attached drawings.

BRIEF DESCRIPTION OF THE DRAWINGS

FIG. 5 is a representation of a Transmitter pop-up window in the user interface for providing ISI scaling to Touchstone files according to the present invention.

DETAILED DESCRIPTION OF THE INVENTION

Figure 1:
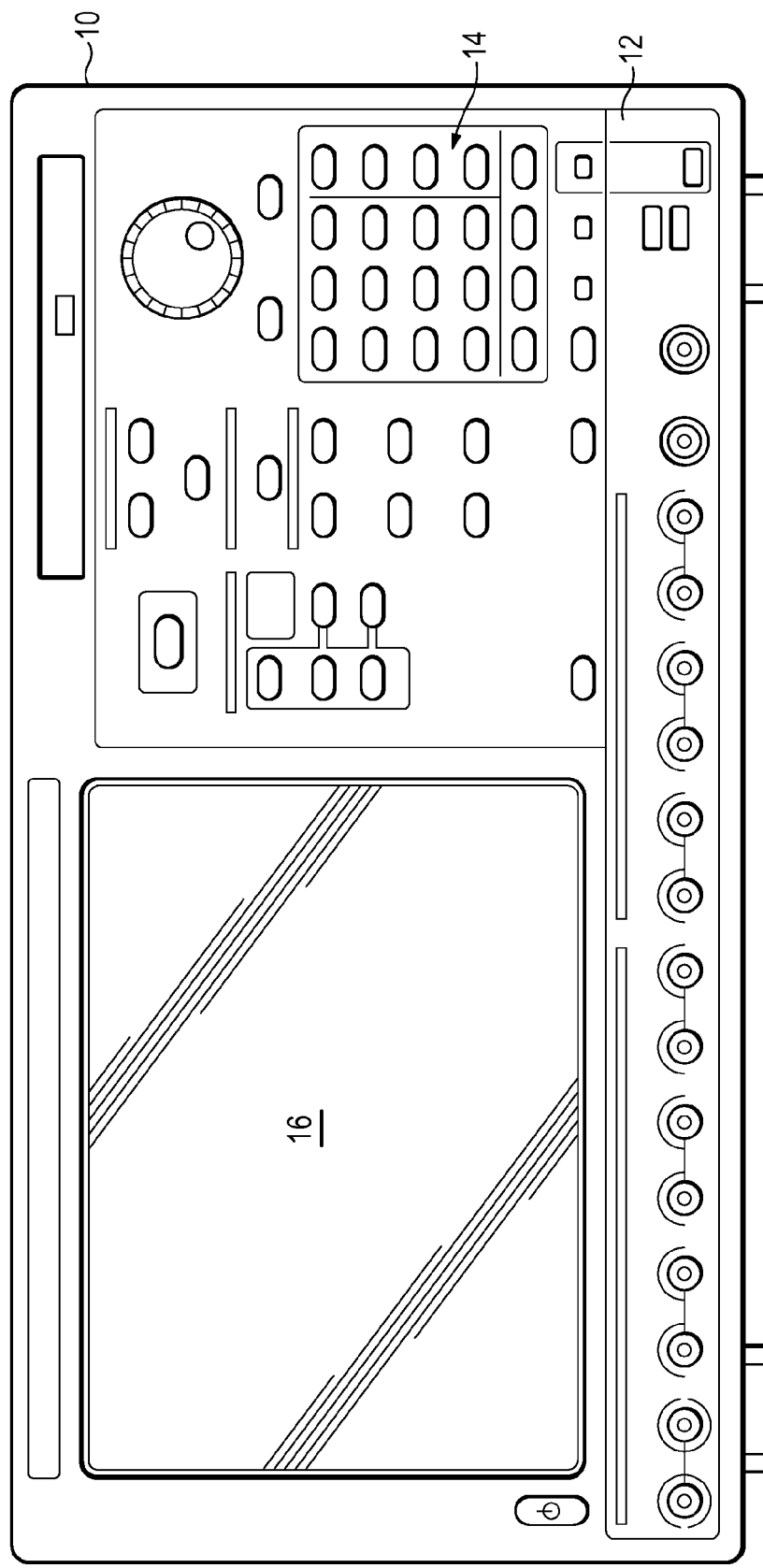
FIG. 1 is a front view of a signal generator providing ISI scaling to Touchstone files according to the present invention.

Referring to FIG. 1, there is shown a signal generator 10, such as the AWG7102 manufactured and sold by Tektronix, Inc. Beaverton, Oreg. The signal generator 10 has a front panel 12 with controls 14, such as buttons and knobs or the like, and a display device 16, such as a liquid crystal display, cathode ray tube or the like. The signal generator 10 also has a CD or DVD/CD drive for storing waveform data, executable programs and the like. User defined signals are generated and output by the signal generator 10 using the front panel controls in conjunction with a user interface displayed on the display device 16.

Figure 2:
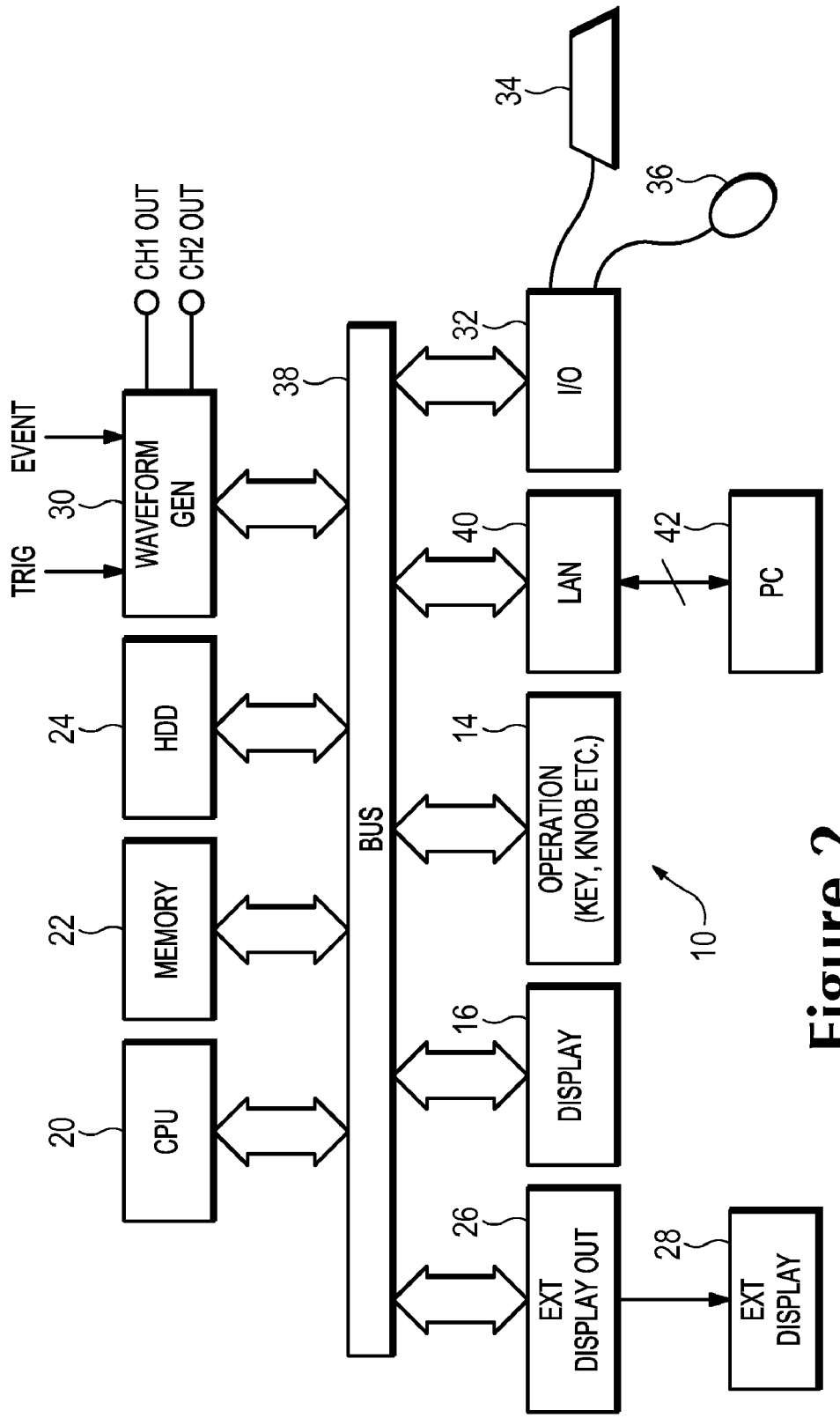
FIG. 2 is a representative block diagram of a signal generator according to the present invention.

Referring to FIG. 2, there is shown a representative block diagram of the AWG7102 signal generator 10 providing intersymbol interference (ISI) scaling to Touchstone files. The signal generator 10 has a central processing unit (CPU) 20 that controls the operation of the instrument according to programs stored on electronic media, such as a Compact Disc (CD). A memory 22, such as RAM memory, is used for a work area for the CPU 20 to read programs from storage device 24, such as a hard disk drive. A user can set up the signal generator 10 to generate an output test signal via the buttons, knobs and the like 14 on the front panel 12 of the instrument. The display device 16 may display a user interface for setting various parameters for the output test signal and visualizing an output signal as a function of the parameter settings. An external display output circuit 26 provides a video output which may be connected to an external display 28 for providing a larger display area in addition to the built-in display 16 of the signal generator 10. A waveform generation circuit 30 generates the output test signal based on user defined parameters. In this example, the waveform generator circuit 30 has a trigger input and an event input and two channel outputs. An input/output port 32 is used for connecting an external keyboard 34, a pointing device, such as a mouse 36, and the like to the signal generator. The external keyboard 34 and/or mouse 36 may be included as part of the front panel controls of the signal generator 10 for setting parameters. The circuits are coupled together via a signal and data bus 38. The bus 38 of the signal generator 10 may have a Local Area Network (LAN) interface 40 for connecting the signal generator 10 to an external controller, such as a personal computer (PC) 42 or other testing instruments. The LAN interface 40 allows the user interface to operate on the PC 42 and pass output signal data to the signal generator 10 and also enables the PC 42 to control the signal generator 10 over a network. Alternatively, a General Purpose Interface Bus (GPIB) interface may be used for the LAN interface 40.

Figure 3:
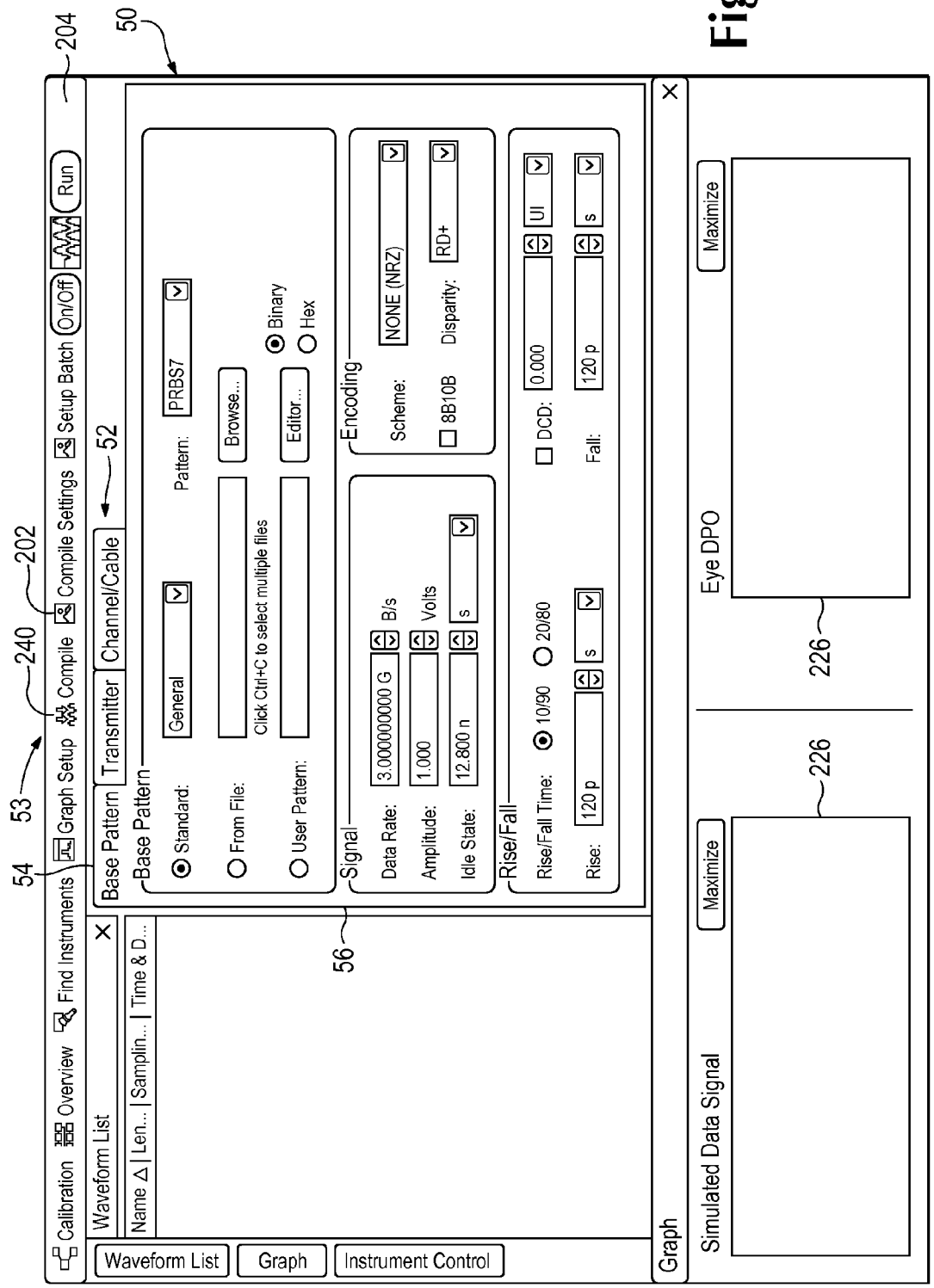
FIG. 3 is an initial user interface for providing ISI scaling to Touchstone files according to the present invention.

Referring to FIG. 3, there is shown an initial user interface 50 for setting parameters of a serial data pattern that is modified by ISI scaling of Touchstone files. The initial user interface 50 and subsequent user interfaces operate under program control of the CPU 20 with the user interface programs stored on the storage device 24. The user interfaces may be displayed on the display device 16 or on the external display 28. Alternately, the user interface programs may be stored and accessed by the PC 42 with the PC 42 processing the parameters and generating an output file that is coupled to the signal generator 10. The programs controlling the various interfaces on the signal generator 10 may be accessed via an icon on the display device 16 or by clicking on a start tab and clicking the appropriate program from a list of programs stored in the signal generator 10. The initial interface 50 includes a number of pop-up windows that are activated by clicking on various tabs 52 or buttons 53 in the initial user interface 50. The initial user interface 50 has a BASE PATTERN tab 54 that activates a BASE PATTERN pop-up window 56. The BASE PATTERN pop-up window 56 is automatically activated with the initial user interface 50.

Figure 4:
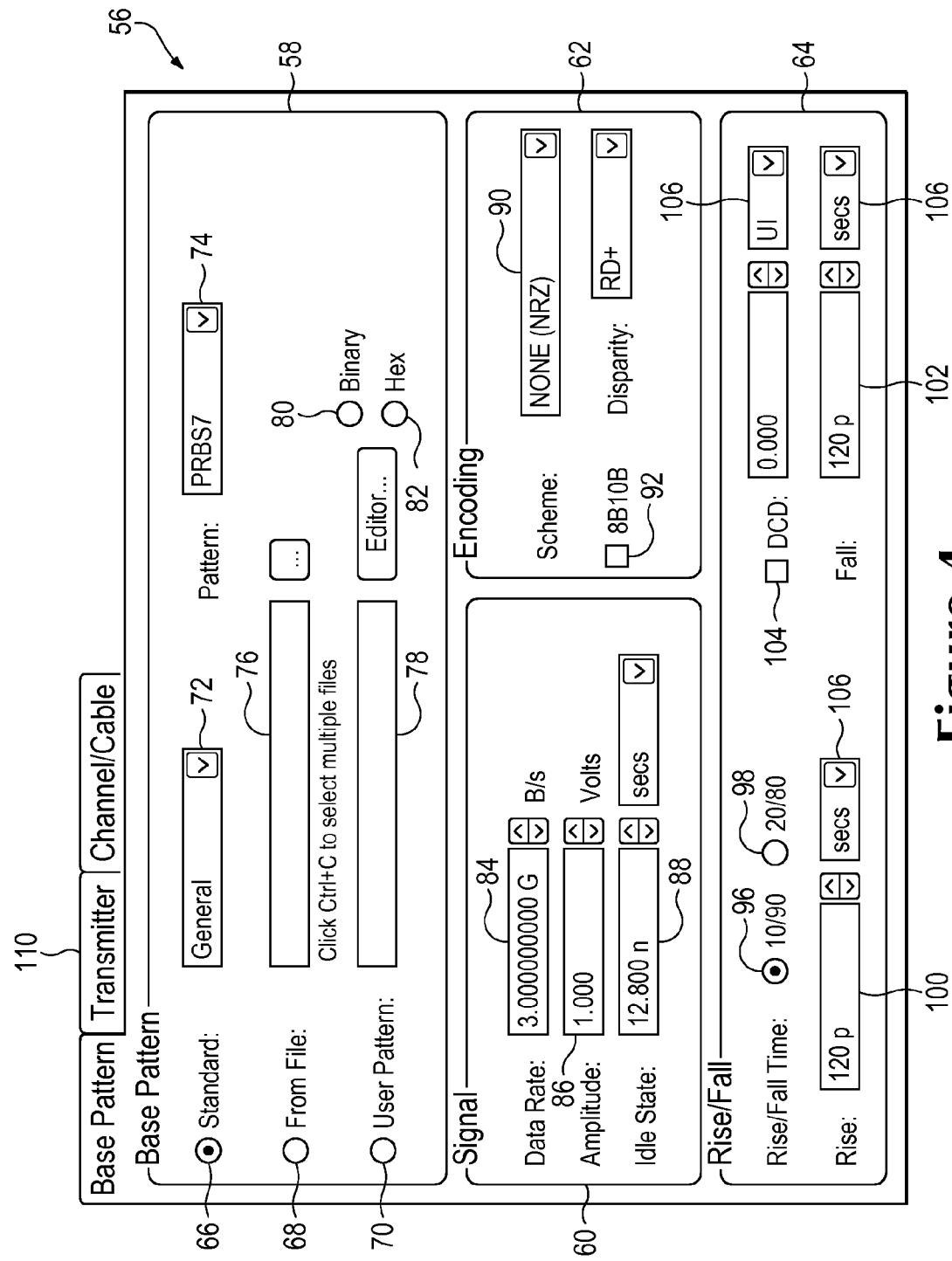
FIG. 4 is representation of a base pattern pop-up window in the user interface for providing ISI scaling to Touchstone files according to the present invention

FIG. 4 is a more detailed representation of the BASE PATTERN pop-up window 56 showing four defined regions of the BASE PATTERN pop-up window 56: BASE PATTERN 58, SIGNAL 60, ENCODING 62 and RISE/FALL 64. The BASE PATTERN region 58 has buttons 66, 68 and 70 that allows a user to select a serial data pattern on which the ISI effects are generated. Clicking on the STANDARD button 66 activates a STANDARD box 72 and a PATTERN box 74. Click on the STANDARD box 72 displays a general serial data pattern and various serial data standards requiring compliance testing. Once a particular serial data standard is selected, clicking on the PATTERN box 74 displays various waveform patterns defined by the selected serial data standard, such as PRBS7. Clicking on the FROM FILE button 68 highlights a FILE box 76 in which a user can enter a previously stored data file. Clicking on the USER PATTERN button 70 highlights a Pattern Box 78 in which a user may enter a serial data pattern. The pattern may be entered as "0" and "1" binary data or hexadecimal data by clicking on appropriate BINARY or HEX buttons 80, 82.

The SIGNAL region 60 has a DATA RATE box 84, an AMPLITUDE box 86, and an IDLE STATE box 88. Clicking on the DATA RATE box 84 allows a user to set the data rate of the serial data. The data rate may be adjusted from 10 Mega Bits per second to 20 Giga bits per second. When the STANDARD button 66 is activated, the data rate is automatically selected as a function of the selected serial data standard. Clicking on the AMPLITUDE box 86 allows the user to select the voltage level of the serial data pattern. The user may vary the voltage level from 250 mV to 1V. The IDLE STATE box 88 is active when SATA is selected in the STANDARD box 72 and Idle Pattern is selected in the PATTERN box 74. The Idle State may be viewed as selectable periods of DC within the Idle State pattern.

The ENCODING region 62 has an ENCODING SCHEME box 90 that allows the user to set the type of coding scheme for the serial data pattern. A user may select from NRZ or NONE NRZ. Clicking on the 8B10B box 92 activates an algorithm for the mapping of 8-bit symbols to 10-bit symbols to achieve DC-balance and bounded disparity. The RISE/FALL region 64 has RISE/FALL TIME buttons 96 and 98 for respectively selecting 10/90 or 20/80 percent rise and fall time. A RISE box 100 allows the user to select the rise time of the serial data pattern leading edges. A FALL box 102 allows the user to set the fall time of the serial data pattern trailing edges. The DCD box 104 allows the user to vary the amount of Duty Cycle Distortion in the serial data pattern. The rise, fall and DCD times may be defined in seconds or unit intervals using the respective SETTING boxes 106.

Figure 5:
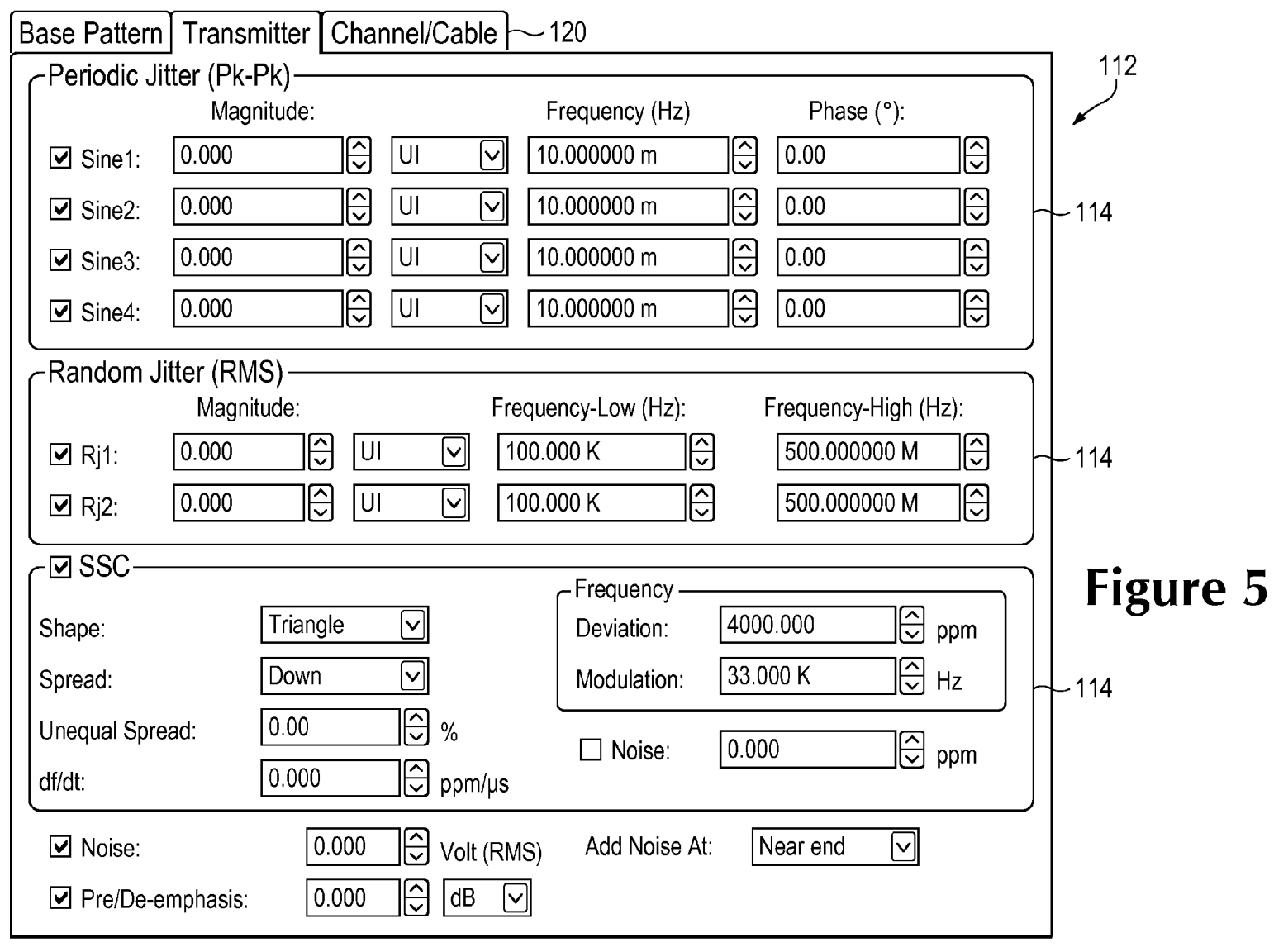

Clicking on the TRANSMITTER tab 110 activates a TRANSMITTER pop-up window 112 as shown in FIG. 5. The TRANSMITTER pop-up window 112 has boxes 114 that allow the user to set parameters for variable amounts of peak-to-peak Periodic Jitter and RMS Random Jitter, set Spread Spectrum Clock (SSC) parameters, Noise parameters in Volts (RMS) and Pre/De-emphasis parameters in dB or volts. The user has the option of placing the noise at the near end or the far end of the serial data pattern.

Figure 6:
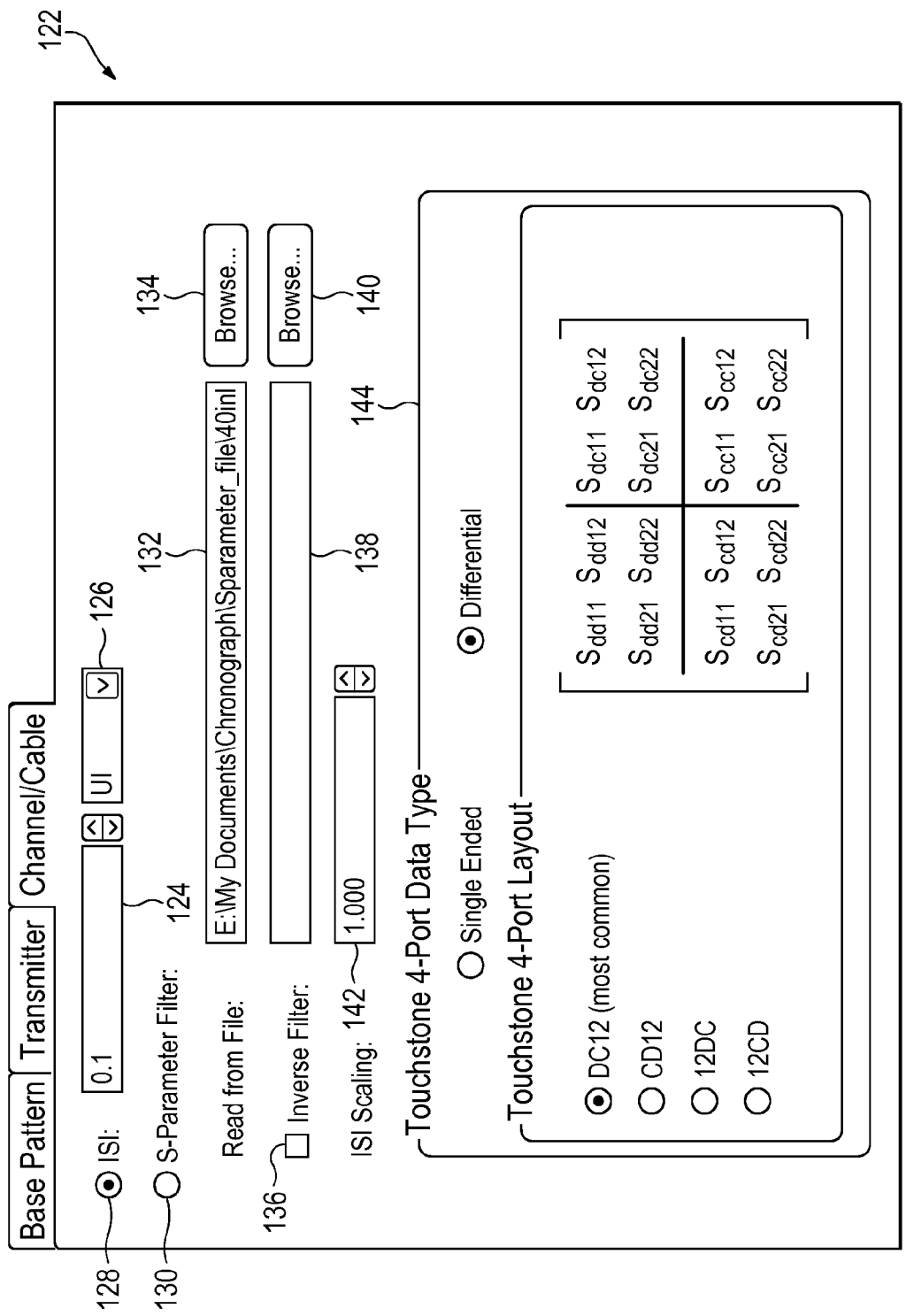
FIG. 6 is a representation of a channel/cable pop-window in the user interface for providing ISI scaling to Touchstone files according to the present invention.

Clicking on the CHANNEL/CABLE tab 120 activates a CHANNEL/CABLE pop-window 122 as shown in FIG. 6. The user may activate an ISI box 124 and SETTING box 126 by clicking on an ISI button 128. In the present invention, the user clicks on an S-PARAMETER FILTER button 130 to activate various S-Parameter Filter boxes and buttons. A READ FROM FILE box 132 and associated BROWSE button 134 allows the user to select a previously stored S-Parameter Touchstone file. Clicking on an INVERSE FILTER button 136 activates an INVERSE FILTER box 138 and associated BROWSE button 140 to allow the user to select a previously stored S-Parameter Touchstone file. An ISI SCALING box 142 allows the user to select an ISI scaling factor value which in the preferred embodiment is varied from 0.000 to 10.000 in increments of 0.001. Below the ISI SCALING box 142 is a SELECTION region 144 that displays various selection options for various ports defined by the S-Parameter Touchstone files.

Figure 7:
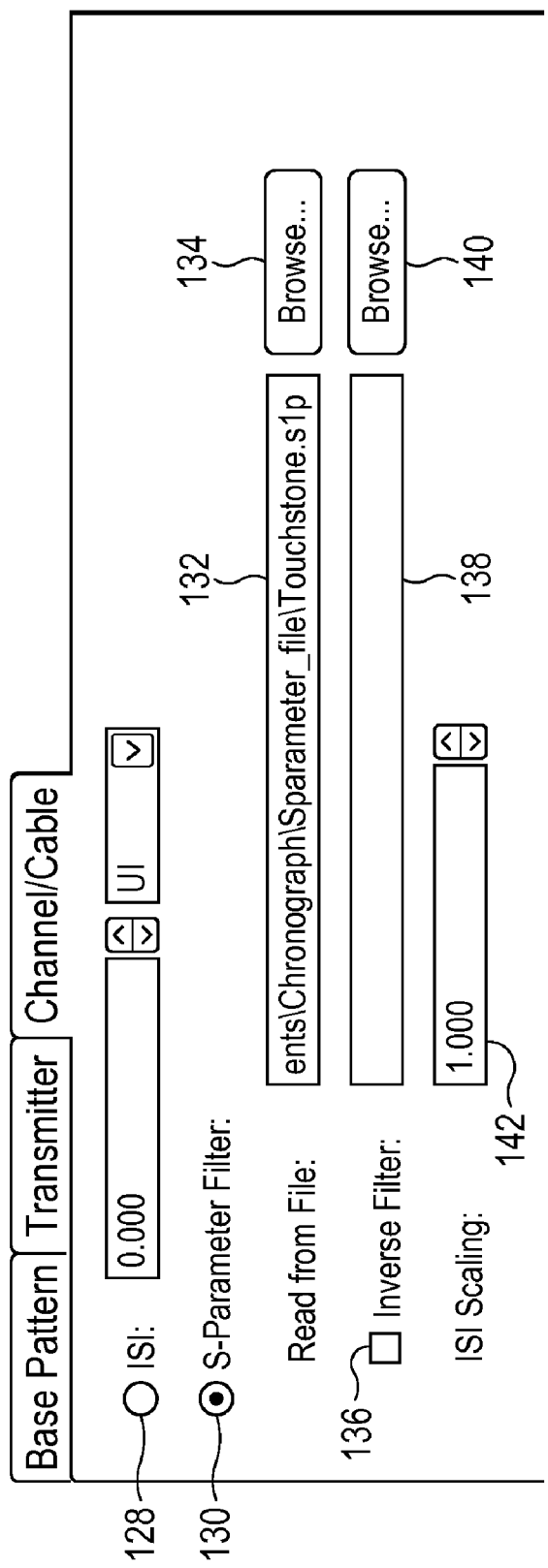
FIG. 7 is a representation of the channel/cable pop-up window for a 1-Port S-Parameter Touchstone file in the user interface for providing ISI scaling to Touchstone files according to the present invention.

FIG. 7 illustrates the selection of a 1-port S-Parameter Touchstone file where the file extension "s1p" identifies the numbers of ports characterized in the Touchstone file. The 1-port S-Parameter Touchstone file, as defined in the present invention, is the $S_{21}$ transmission coefficient of a 2-port S-Parameter Touchstone file. The convention is different from the EIA/IBIS Open Forum Draft of the Touchstone File Format Specification, Rev 1.1. Because the 1-port S-parameter Touchstone file has a single S-Parameter, the SELECTION region 144 is left empty.

Figure 8:
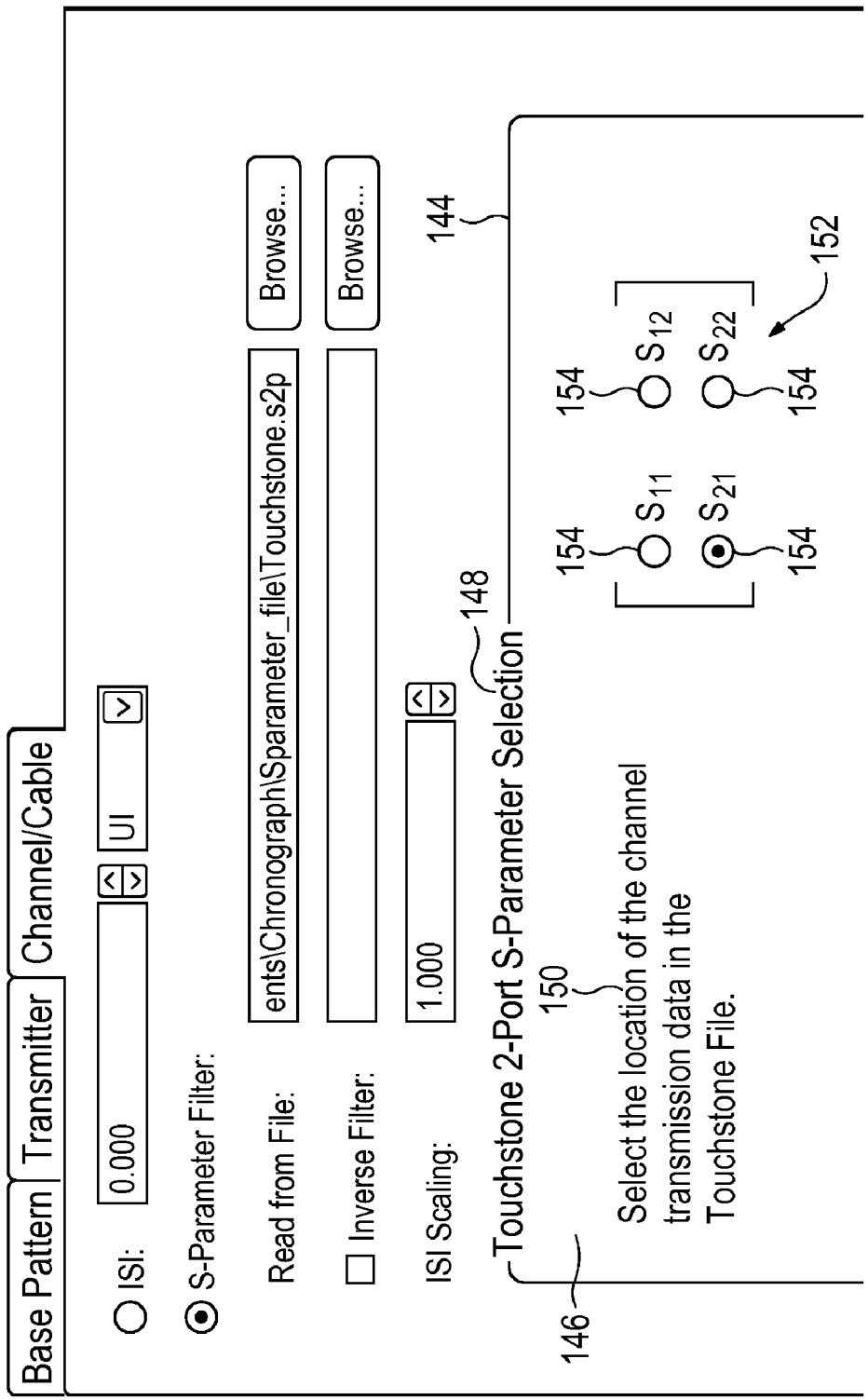
FIG. 8 is a representation of the channel/cable pop-up window for a 2-Port S-Parameter Touchstone file in the user interface for providing ISI scaling to Touchstone files according to the present invention.

FIG. 8 illustrates a 2-port S-Parameter Touchstone file with a file extension of "s2p". A 2-PORT display 146 is generated in the SELECTION region 144 for selecting 2-Port S-Parameter coefficients defined in the Touchstone file format. The PORT display 146 has an IDENTIFICATION HEADER 148 identifying the PORT display 146 as a Touchstone 2-Port S-Parameter Selection display. Within the PORT DISPLAY 146, there is a CHANNEL TRANSMISSION DATA prompt 150 for selecting the location of the channel transmission data in the Touchstone file. Adjacent to the prompt 150 is a 2-Port S-Parameter matrix 152 listing the S-parameter coefficients in the Touchstone file. Next to each S-Parameter is a button 154 for selecting that S-parameter. The S-Parameter coefficients for channel transmission data is the $S_{21}$ S-Parameter for forward channel transmission and the $S_{12}$ S-Parameter for reverse channel transmission. The $S_{11}$ and $S_{22}$ S-Parameters coefficients are reflection coefficients. Generally, the $S_{21}$ S-Parameter coefficient is selected as shown by the button 154 being selected next to the $S_{21}$ S-Parameter transmission coefficient.

Figure 9:
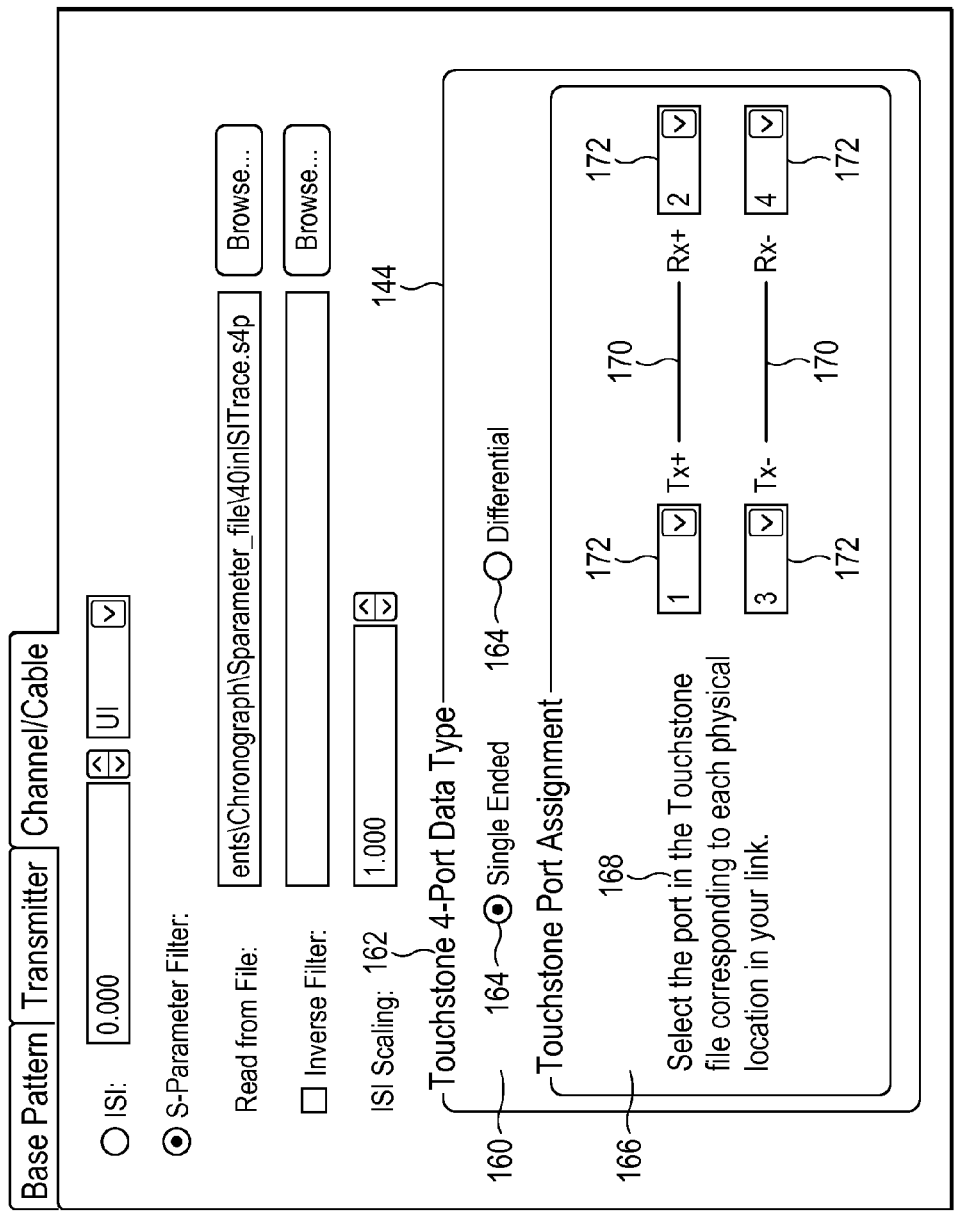
FIG. 9 is a representation of the channel/cable pop-up window for a single ended 4-Port S-Parameter Touchstone file in the user interface for providing ISI scaling to Touchstone files according to the present invention.

FIG. 9 illustrates the selection of a 4-Port S-Parameter Touchstone file with a file extension of "s4p". A 4-PORT display 160 is generated in the SELECTION region 144 for selecting 4-Port data types. The 4-Port display 160 has an IDENTIFICATION HEADER 162 identifying the 4-PORT display 160 as a Touchstone 4-Port S-Parameter Data Type display. Within the 4-PORT display 160, there is displayed the data types which are "SINGLE ENDED" or "DIFFERENTIAL" with each data type having an associated button 164 for selecting a particular data type. When the SINGLE ENDED data type is selected, an additional PORT ASSIGNMENT display 166 is generated. Within the PORT ASSIGNMENT display 166, there is a PORT LINK prompt 168 for linking user defined port assignments of transmission lines under test to ports on a measurement test instrument, such as a Vector Network Analyzer (VNA). In a 4-Port Network, there are two transmission paths with each transmission path having two ports. The user assigns port numbers to each transmission line port. The user connects one or more ports of the VNA to the respective ports of the transmission lines under test. The VNA launches a signal into each port and acquires data for generating S-Parameters that are stores in a Touchstone S-Parameter file. The S-parameters are stored in a specific format in the Touchstone S-parameter file irrespective of the user port assignments. The user has to associate each port of the two transmission paths to the VNA ports to associate the S-parameters in the Touchstone S-Parameter file with the correct ports of the two transmission paths. Adjacent to the PORT LINK prompt 168 is a representation of two transmission paths 170, Tx+ and Rx+ and TX− and Rx−, with each transmission path 170 having PORT ASSIGNMENT boxes 172 associated with each Tx+, Rx+, TX− and Rx−. The user inputs the port numbers assigned to each port by the user in the respective PORT ASSIGNMENT boxes 172.

Figure 10:
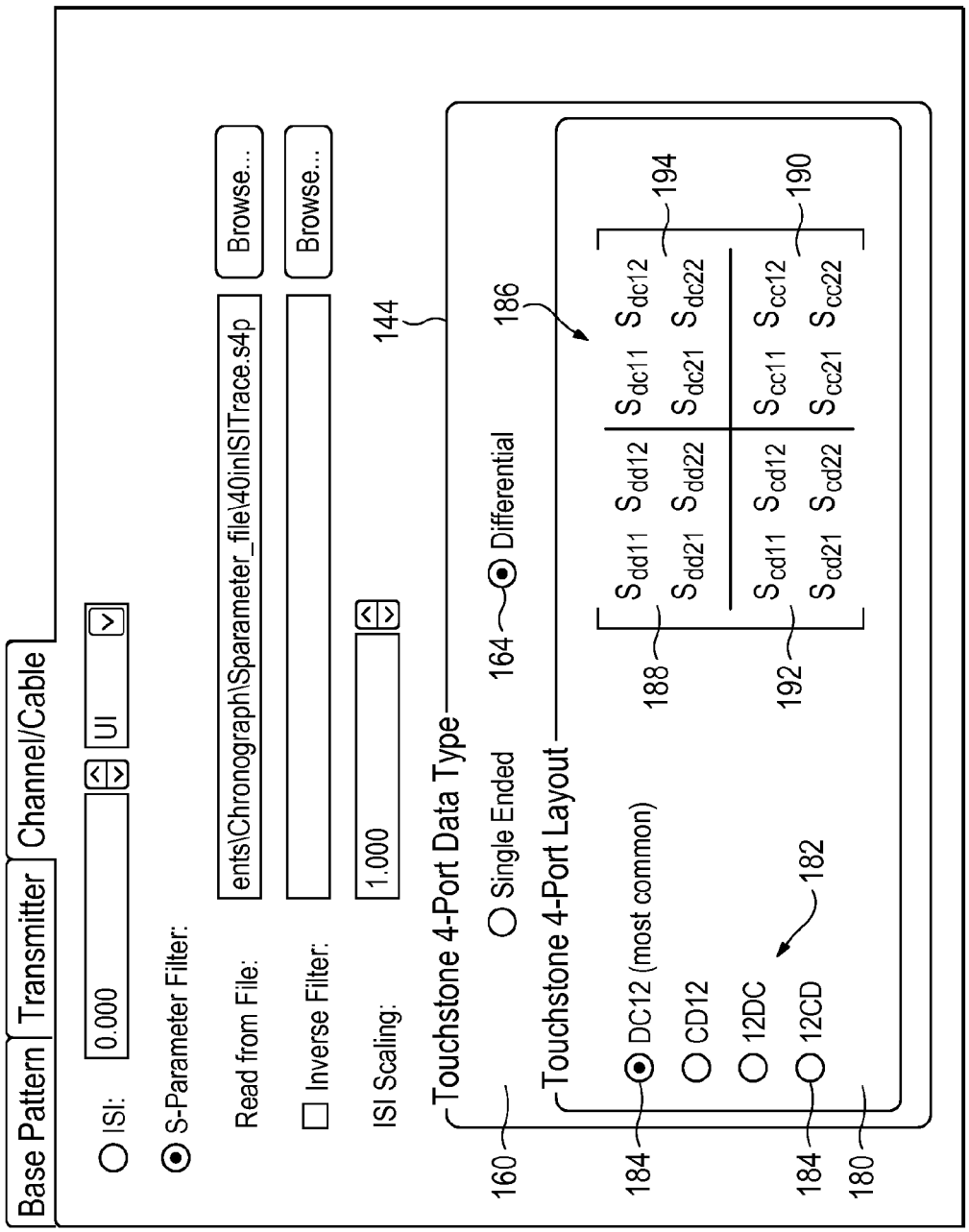
FIG. 10 is a representation of the channel/cable pop-up window for a differential 4-Port S-Parameter Touchstone file in the user interface for providing ISI scaling to Touchstone files according to the present invention.

FIG. 10 illustrates PORT LAYOUT 180 display when the DIFFERENTIAL data type is selected in the 4-Port display 160. The PORT LAYOUT display 180 includes pre-defined MAPPING ACRONYMS 182 with each MAPPING ACRONYMS 182 having an associated button 184. Displayed adjacent to the MAPPING ACRONYMS 182 is a 4-PORT DIFFERENTIAL S-PARAMETER MATRIX 186. The MARTIX 186 displays four 2-Port S-Parameter matrices with the upper left matrix representing a 2-PORT DIFFERENTIAL S-PARAMETER MATRIX 188. The lower right matrix represents a 2-PORT COMMON MODE S-PARAMETER MATRIX 190. The lower left and the upper right matrices represent 2-PORT MIXED DIFFERENTIAL AND COMMON MODE S-PARAMETER MARTICES 192 AND 194. The user selects one of the MAPPING ACRONYMS 182 which maps the 2-Port S-Parameters matrices 188, 190, 192 and 194 to the formatted S-Parameters in the Touchstone S-Parameter file.

As previously stated, clicking on an INVERSE FILTER button 136 (as shown in FIG. 6) activates an INVERSE FILTER box 138 and associated BROWSE button 140 to allow the user to select a previously stored S-Parameter Touchstone file. An inverse filter, such as a pre-emphasis filter, is derived by applying an inverse FFT to the S-Parameter Touchstone file. The pre-emphasis filter removes the physical channel transmission path effects characterized by the S-parameter Touchstone file.

In the preferred embodiment, the Touchstone file contains S-Parameter magnitude data as a function of frequency. A transmission path generally attenuates the higher frequencies resulting in a low pass frequency response. The effects of the transmission path as recorded by the S-parameters in a Touchstone file may be represented by a filter derived from the frequency response of the S-Parameters. The user selects an amount of ISI SCALING using the ISI SCALING box 142 which modifies the shape of the frequency response filter derived from the modified S-Parameters in the Touchstone S-Parameter file as follows. The S-Parameters magnitude responses for each of the given set of frequencies are first converted to a linear scale. The minimum linear magnitude response is subtracted from the other linear magnitude responses as represented by Equation 1:

$$M1(f)=M(f)-\min[M(f)] \quad \text{EQ (1)}$$

where M(f) are the magnitude responses as a function of frequency and the min [M(f)] is the magnitude value of the minimum magnitude value, generally the last frequency point for $S_{21}$ and $S_{12}$ S-parameters. The linear magnitude values M1 (f) are multiplied by the ISI Scaling Value with the results being added to minimum linear magnitude response min [M(f)] as represented by Equation 2:

$$M2(f)=a \times M1(f)+\min[M(f)] \quad \text{EQ (2)}$$

where "a" is the ISI scaling value. The scaled linear magnitude values M2 (f) are divided by the maximum linear magnitude response of the scaled linear magnitude values M2 (f) as represented by the Equation 3:

$$M3(f)=M2(f)/\max[M2(f)] \quad \text{EQ (3)}$$

where M3 (f) is the scaled frequency response.

Figure 11:
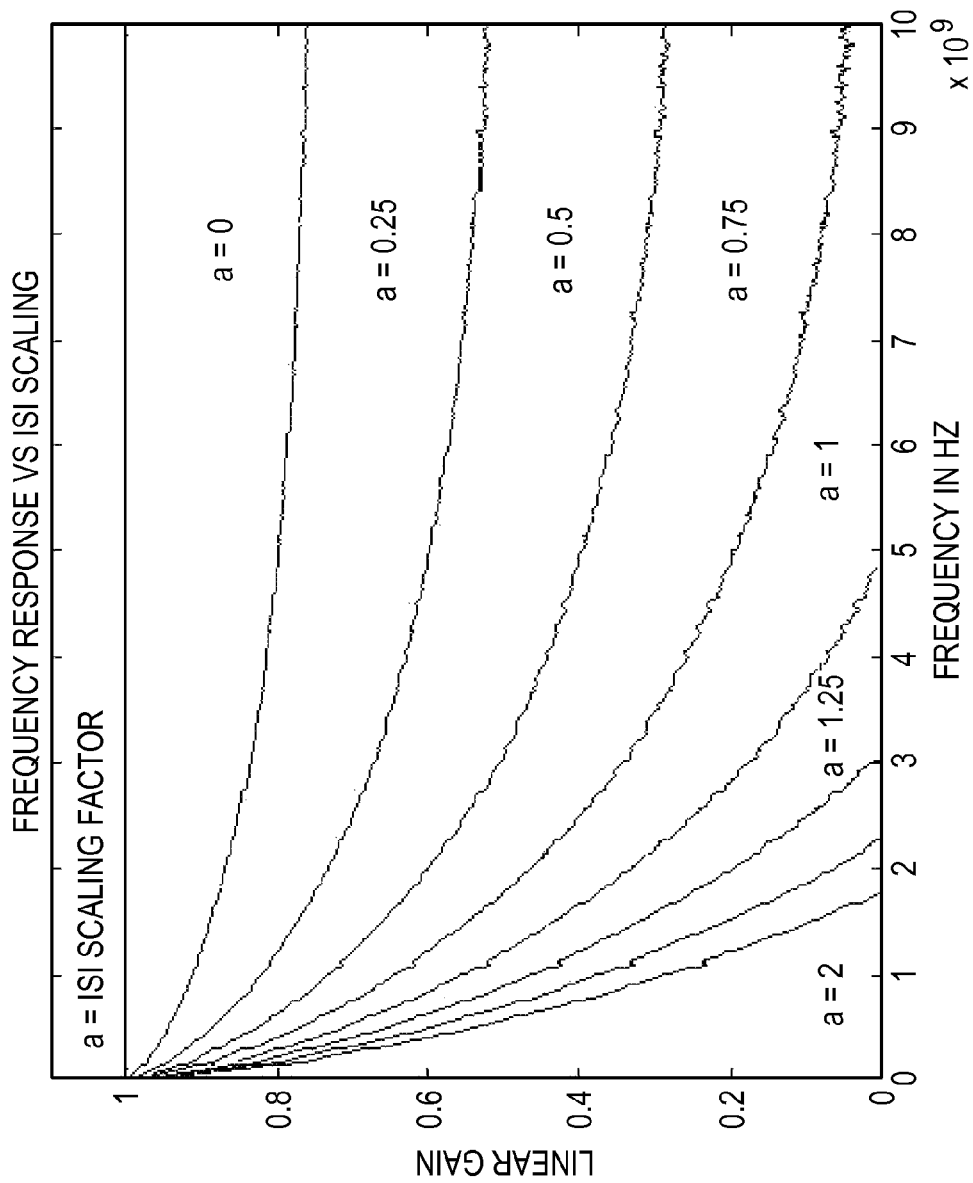
FIG. 11 is a graphical representation of the frequency response for different scaling factor values in the user interface for providing ISI scaling to Touchstone files according to the present invention.

FIG. 11 illustrates the frequency response for different scaling factor values "a". a=0 corresponds to an all pass filter which totally removes the effect of the transmission path. a=1 corresponds to the frequency response of the Touchstone file. As "a" is increased from 0 to 1, the effect of the transmission path is gradually included in the serial data pattern. With increases greater than 1, the effect of the transmission path is increased on the serial data pattern.

Figure 12:
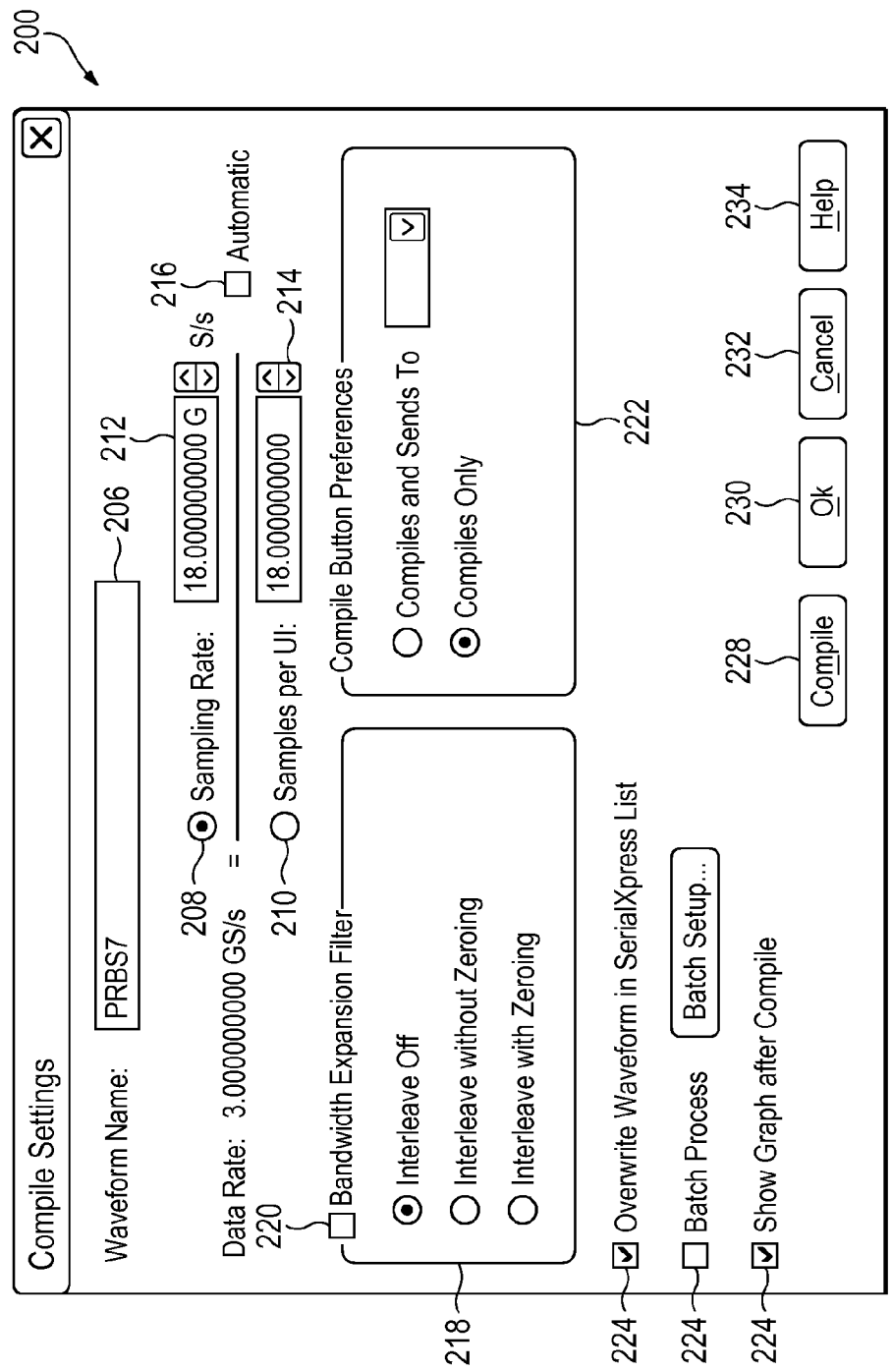
FIG. 12 is a representation of a compiles setting pop-up window in the user interface for providing ISI scaling to Touchstone files according to the present invention.

Referring back to FIG. 3, once the user has set the parameters for the serial data pattern and selected the S-Parameter Touchstone file and the amount of ISI scaling to be applied to the Touchstone file, the user activates a COMPILE SETTINGS pop-up window 200, shown in FIG. 12, by clicking on a COMPILE SETTINGS button 202 on the initial user interface 50 tool bar 204. The COMPILE SETTINGS pop-up window 200 has a WAVEFORM NAME box 206 for providing a user defined name for a waveform file generated by the signal generator 10 using the user defined parameters for the serial data pattern and ISI scaling value for the selected S-Parameter Touchstone file. The data rate for the serial data pattern entered using the BASE PATTERN pop-up window 56 is displayed next to "Data Rate". The user can click on a SAMPLE RATE button 208 or a SAMPLES PER UI button 210 to activate respective SAMPLE RATE or SAMPLES PER UI boxes 212, 214. The user may manually set the sampling rate or samples per UI by entering appropriate values based on the serial data pattern and the data rate. The sampling rate or samples per UI may be automatically set based on the data rate and the serial data pattern by clicking on AUTOMATIC box 216. A BANDWIDTH EXPANSION FILTER region 218 may be activated by clicking on a BANDWIDTH EXPANSION FILTER button 220. The BANDWIDTH EXPANSION FILTER region 218 allows a user to select or turn off various interleaving parameters. A COMPILE BUTTON PREFERENCES region 222 allows the user to select either COMPILE ONLY or COMPILE AND SENT TO parameters for the compiled waveform record defined by the serial data pattern parameters and the ISI scaling value parameter. Toward the bottom of the COMPILE SETTINGS pop-up window 200 are additional parameters that may be set by clicking on the appropriate boxes 224. One of the parameters is SHOW GRAPH AFTER COMPILE which displays the serial pattern data in various forms in two graph regions 226 at the bottom of the initial user interface 50. At the bottom of the COMPILE SETTINGS pop-up window 200 are COMPLE, OK, CANCEL and HELP buttons 228, 230, 232 and 234 that allows the user to select various options related to the COMPILE SETTINGS pop-up window 200. One option is to click on the COMPILE button 228 that initiates the compiling of the serial data pattern parameters and ISI scaling value applied to the S-Parameter Touchstone file to generate a waveform record file containing digital data for generating an analog serial data pattern from the signal generator 10. Another option is to click on the OK button 230 that saves the parameters selected in the COMPILE SETTINGS pop-up window 200 and closes the window 200. A further option is to click on the CANCEL button 232 that closes the COMPILE SETTINGS pop-up window 200 without saving the parameters selected in the window 200. Clicking on the HELP button 234 activates a HELP pop-up window from which the user may seek help.

The initial user interface 50 tool bar 204 has a COMPILE button 240 (as shown in FIG. 3) that functions in the same manner as the COMPILE button 228 (as shown in FIG. 7) in the COMPILE SETTINGS pop-up window 200 by initiating the compiling of the serial data pattern parameters and ISI scaling value applied to the S-Parameter Touchstone file to generate a waveform record file containing digital data for generating an analog serial data pattern from the signal generator 10.

Figure 13A:
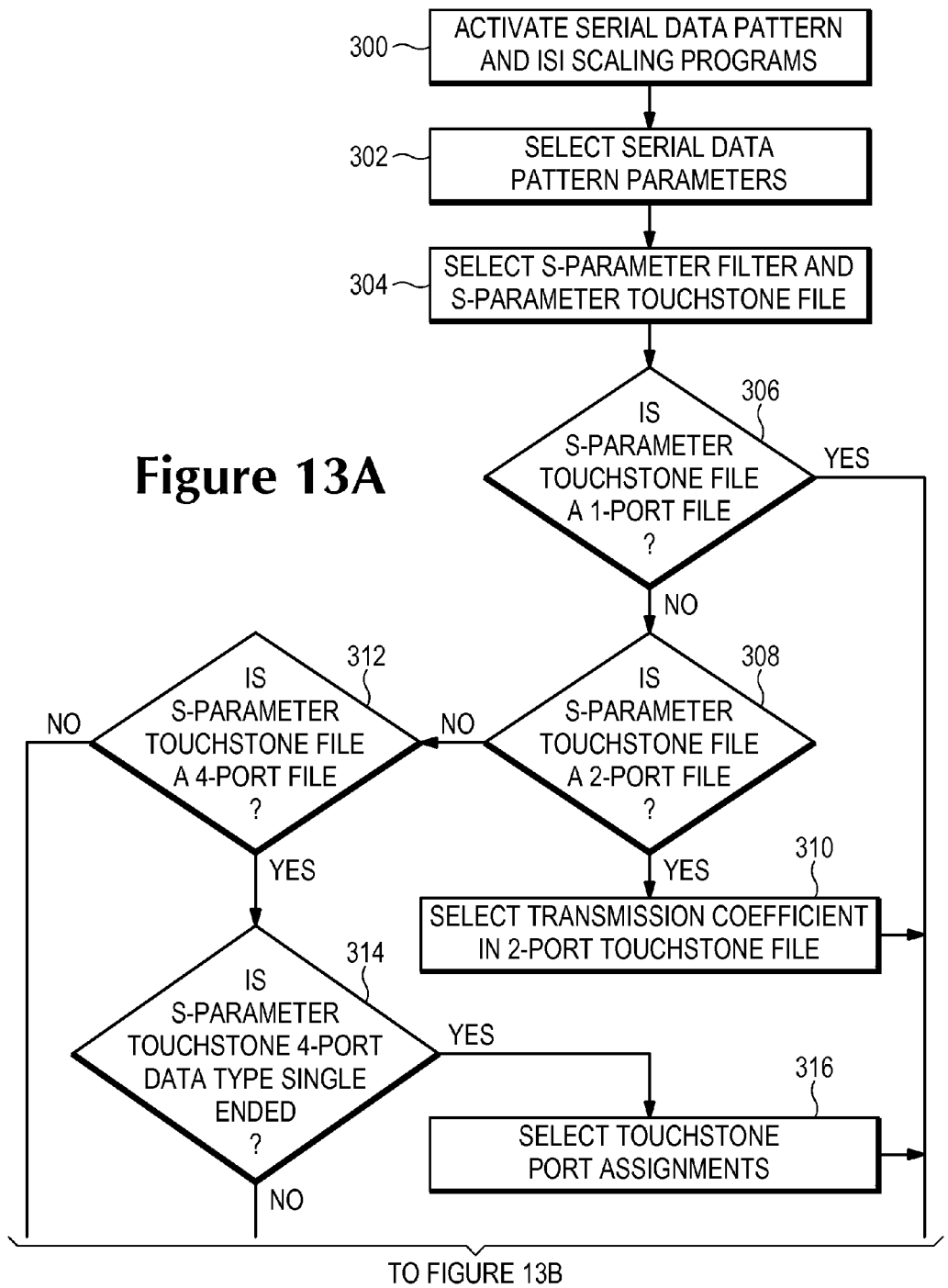
FIGS. 13A and 13B are a flow chart representing the generation of a serial data pattern having scaled ISI effects.
Figure 13B:
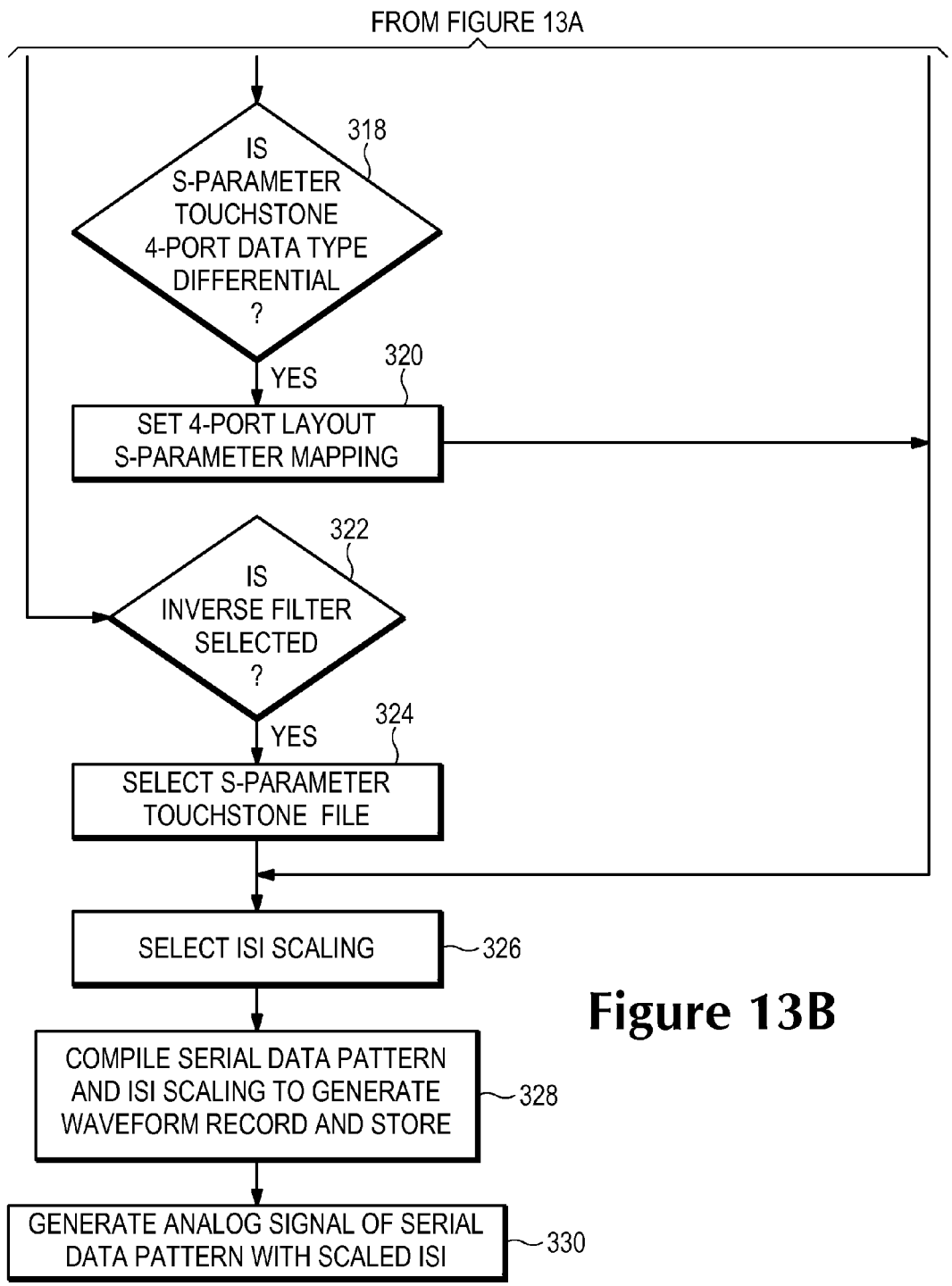

The ISI scaling of an S-Parameter Touchstone file is used with a selected serial data pattern to produce an analog serial data pattern output from the signal generator 10. FIGS. 13A and 13B represent a flow chart illustrating the steps in generating an analog serial data pattern with ISI scaling of an S-Parameter Touchstone file. The serial data pattern and ISI scaling programs are activated at step 300. The serial data pattern parameters are set by the user at step 302, such as a general standard having a PRBS7 pattern having a date rate of 3 GB/s, a voltage amplitude of 1V, an encoding scheme that does not return to zero, rise and fall times of the leading and trailing edges of the serial data pattern of 120 psec at a 10 to 90 percent level and a sample rate of 18 Gs/s. The jitter, SSC, noise and Pre/De-emphasis parameters in the TRANSMITTER pop-up window 112 are set to zero.

The user activates the CHANNEL/CABLE pop-window 122 by clicking on the CHANNEL/CABLE tab 120, clicks on the S-PARAMETER FILTER button 130 to activate the various S-Parameter Filter boxes and buttons and selects a previously stored S-Parameter Touchstone file using the READ FROM FILE box 132 and associated BROWSE button 134 as shown in step 304. At step 306 a determination is made whether the S-Parameter Touchstone file is a 1-port file. If the S-Parameter Touchstone file is a 1-port file, then the programs proceed to the select ISI scaling step 326. If the S-Parameter Touchstone file is not a 1-port file, then a determination is made whether the S-Parameter Touchstone file is a 2-Port S-Parameter Touchstone file at step 308. If the S-Parameter Touchstone file is a 2-port file, then an S-Parameter transmission coefficient is selected using the 2-Port S-Parameter matrix 150 in the PORT display 146 at step 310. If the S-Parameter Touchstone file is not a 2-port file, then a determination is made whether the S-Parameter Touchstone file is a 4-Port S-Parameter Touchstone file at step 312. If the S-Parameter Touchstone file is a 4-Port S-Parameter Touchstone file, then a determination is made whether the S-Parameter Touchstone file data type is SINGLE ENDED at step 314. If the data type is SINGLE ENDED, then port assignments are selected at step 316 using the PORT ASSIGNMENT display 166 and the PORT ASSIGNMENT boxes 170. If a determination is made that the S-Parameter Touchstone file data type is not SINGLE ENDED, then a determination is made whether the data type is DIFFERENTIAL at step 318. If the data type is DIFFERENTIAL, then the 2-Port S-Parameters matrices 188, 190, 192 and 194 are formatted to the S-Parameters in the Touchstone S-Parameter file at step 320 using the PORT LAYOUT display 180 and the MAPPING ACRONYMS 182. If the S-Parameter Touchstone file is not a 4-Port S-Parameter Touchstone file, then a determination is made whether the INVERSE FILTER button 136 is selected at step 322. If the INVERSE FILTER button is selected, then the INVERSE FILTER box 138 and associated BROWSE button 140 are used at step 324 to select a previously stored S-Parameter Touchstone file.

The user selects the ISI scaling value at step 326 using the ISI SCALING box 142. The selection of the ISI scaling value can occur when the Touchstone file is a 1-Port S-Parameter Touchstone file, or the transmission coefficient is selected for a 2-Port S-Parameter Touchstone file, or the Touchstone port assignments are selected for the single ended 4-Port S-Parameter Touchstone file, or the 4-Port layout S-parameter mapping is set for the 4-Port S-Parameter Touchstone file, or the inverse filter Touchstone S-Parameter file is selected. Alternately, the ISI scaling value may be selected before or during selection of the S-Parameter Touchstone files and the various selections for the S-Parameter Touchstone files.

The serial data pattern parameters and the ISI scaling value used with the selected S-Parameter Touchstone file are compiled at step 328 to generate a waveform record file containing digital data for generating an analog serial data pattern with ISI scaling effects on a transmission path defined by an S-Parameter Touchstone file. The waveform record file is processed by the waveform generation circuit 30 which converts the digital data in the waveform record file to an analog serial data pattern with ISI scaling effects and the signal generator 10 generates an analog serial data pattern with ISI scaling effects output at step 330.

Although the invention has been disclosed in terms of the preferred and alternative embodiments disclosed herein, those skilled in the art will appreciate that modifications and improvements may be made without departing from the scope of the invention.

What is claimed is:

1. A signal generating device comprising:
   a display;
   a central processing unit generating a user interface on the display for setting parameters of a serial data pattern, selecting an S-parameter file representing a measured signal path and an intersymbol interference scaling value for scaling magnitude values in the S-parameter file wherein magnitude responses for each of a given set of frequencies of the S-parameter file are converted to linear magnitude responses with the minimum linear magnitude response of the linear magnitude responses subtracted from the other linear magnitude responses and the resulting linear magnitude responses multiplied by the intersymbol interference scaling value with the linear minimum magnitude response added to each of the resulting linear magnitude responses multiplied by the intersymbol interference scaling value and the resulting linear magnitude responses multiplied by the intersymbol interference scaling value divided by the maximum linear magnitude response of the linear magnitude responses and a waveform record file is generated using the serial data pattern parameters and the S-parameter file modified by the intersymbol interference scaling value; and
   a waveform generation circuit receiving the waveform record file and generating a serial data pattern analog output signal modified by the S-parameter file having magnitude values scaled by the intersymbol interference scaling value.

2. The signal generating device as recited in claim 1 wherein the display comprises an external display coupled to the signal generating device.

3. The signal generating device as recited in claim 1 further comprising an external controller coupled to the signal generating device with the external controller generating the user interface on an external display for setting parameters for the serial data pattern, selecting an S-parameter file representing a measured signal path and an intersymbol interference scaling value for scaling magnitude values in the S-parameter file wherein magnitude responses for each of a given set of frequencies of the S-parameter file are converted to linear magnitude responses with the minimum linear magnitude response of the linear magnitude responses subtracted from the other linear magnitude responses and the resulting linear magnitude responses multiplied by the intersymbol interference scaling value with the linear minimum magnitude response added to each of the resulting linear magnitude responses multiplied by the intersymbol interference scaling value and the resulting linear magnitude responses multiplied by the intersymbol interference scaling value divided by the maximum linear magnitude response of the linear magnitude responses and generating a waveform record file using the serial data pattern parameters and the S-parameter file modified by the intersymbol interference scaling value for use by the waveform generation circuit.

4. The signal generating device as recited in claim 1 wherein the S-parameter file is a Touchstone file.

5. The signal generating device as recited in claim 1 wherein the S-parameter file is a 1-port S-parameter file.

6. The signal generating device as recited in claim 1 wherein the S-parameter file is a 2-port S-parameter file.

7. The signal generating device as recited in claim 1 wherein the S-parameter file is a 4-port single ended S-parameter file.

8. The signal generating device as recited in claim 1 wherein the S-parameter file is a 4-port differential S-parameter file.

9. The signal generating device as recited in claim 1 wherein the intersymbol interference scaling factor value has a range from 0.0 to 10.0.

10. The signal generating device as recited in claim 9 wherein the central processing unit increments the intersymbol interference scaling value in units of 0.001.

11. A method of generating a serial data pattern representing varying characteristics of a signal path comprising the steps of:
   a) generating a user interface on a display device for setting serial data pattern parameters, selecting an S-parameter file representing a measured signal path and an intersymbol interference scaling value for scaling magnitude values in the S-parameter file using a central processing unit;

b) selecting parameters for a serial data pattern;

c) selecting an S-parameter file representing a measured signal path;

c) selecting an intersymbol interference scaling value for scaling magnitude values in the S-parameter file;

d) converting magnitude responses for each of a given set of frequencies of the S-parameter file to linear magnitude responses;

e) subtracting the minimum linear magnitude response of the linear magnitude responses from the other linear magnitude responses;

f) multiplying the resulting linear magnitude responses by the intersymbol interference scaling value;

g) adding the minimum linear minimum magnitude response to each of the resulting linear magnitude responses multiplied by the intersymbol interference scaling value;

h) dividing the resulting linear magnitude responses multiplied by the intersymbol interference scaling value by the maximum linear magnitude response of the linear magnitude responses;

i) generating a waveform record file using the serial data pattern parameters and the S-parameter file modified by the intersymbol interference scaling value in steps d) through h; and j) generating a serial data pattern analog output signal from the waveform record file having a serial data pattern modified by the S-parameter file having the intersymbol interference scaling value using a waveform generation circuit.

12. The method of generating a serial data pattern representing varying characteristics of a signal path as recited in claim 11 wherein the selecting the S-parameter file further comprises the step of selecting at least a first port configuration for the measured signal path.

13. The method of generating a serial data pattern representing varying characteristics of a signal path as recited in claim 11 wherein the selecting of the intersymbol interference scaling value further comprises the step of incrementing the intersymbol interference scaling value in units of 0.001 over a range of 0.000 to 10.000.

14. The method of generating a serial data pattern representing varying characteristics of a signal path as recited in claim 11 wherein the generating of the waveform record file step further comprises the step of compiling the serial data parameters to generate serial data pattern digital data modified by the S-parameter file having magnitude values determined by the intersymbol interference scaling value.

* * * * *